United States Patent [19]

Tsuda et al.

[11] Patent Number: 4,926,500

[45] Date of Patent: May 15, 1990

[54] FREQUENCY CONVERTER

[75] Inventors: George I. Tsuda, Fullerton; Kernel S. Tsuhako, Cerritos, both of Calif.

[73] Assignee: Hughes Aircraft Company, Los Angeles, Calif.

[21] Appl. No.: 230,638

[22] Filed: Aug. 10, 1988

[51] Int. Cl.$^5$ .......................... H04B 1/10; H04B 1/26
[52] U.S. Cl. .................................. 455/302; 455/315; 455/318
[58] Field of Search ............... 455/316, 118, 318, 208, 455/326, 209, 75, 302, 303, 315, 323, 317, 305; 331/22, 47; 375/102

[56] References Cited

U.S. PATENT DOCUMENTS

| | | | |
|---|---|---|---|
| 4,491,969 | 1/1985 | Datta | 455/75 |
| 4,587,715 | 4/1986 | Baar et al. | 466/326 |
| 4,603,436 | 7/1986 | Butler | 455/326 |

*Primary Examiner*—Reinhard J. Eisenzopf
*Assistant Examiner*—Curtis A. Kuntz
*Attorney, Agent, or Firm*—Wanda K. Denson-Low

[57] ABSTRACT

The invention comprises a frequency converter for converting an input frequency to an output frequency where the frequenicies are widely separated. The system includes a free running output oscillator adapted to be injection locked to an output frequency. A local oscillator having a frequency near the output frequency, has its signal mixed with the input frequency to obtain a signal containing sideband frequencies which are both above and below the local oscillator frequency. Means are provided for separating the sideband frequencies and applying one of the sidebands as an injection locking signal to the free running oscillator. In the preferred embodiment, the bandwidth of the free running output oscillator is centered above the highest sideband frequency if the sideband is lower in frequency than the frequency of the local oscillator or is centered below the lowest sideband frequency is the sideband is higher in frequency than the frequency of the local oscillator.

9 Claims, 1 Drawing Sheet

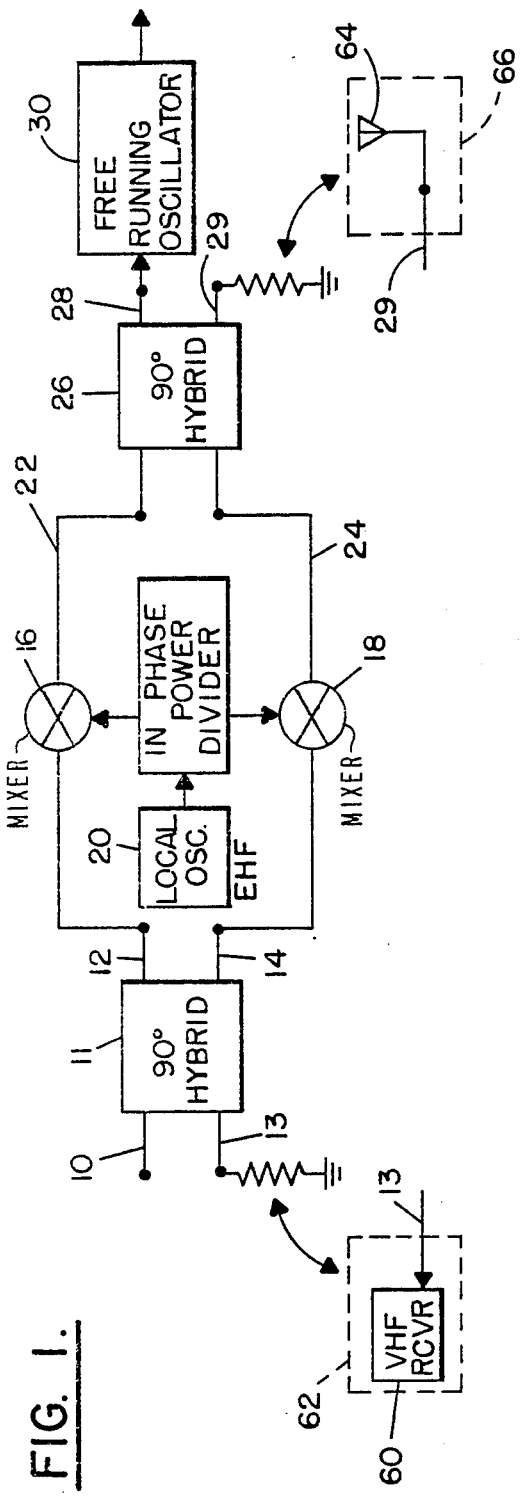
FIG. 1.
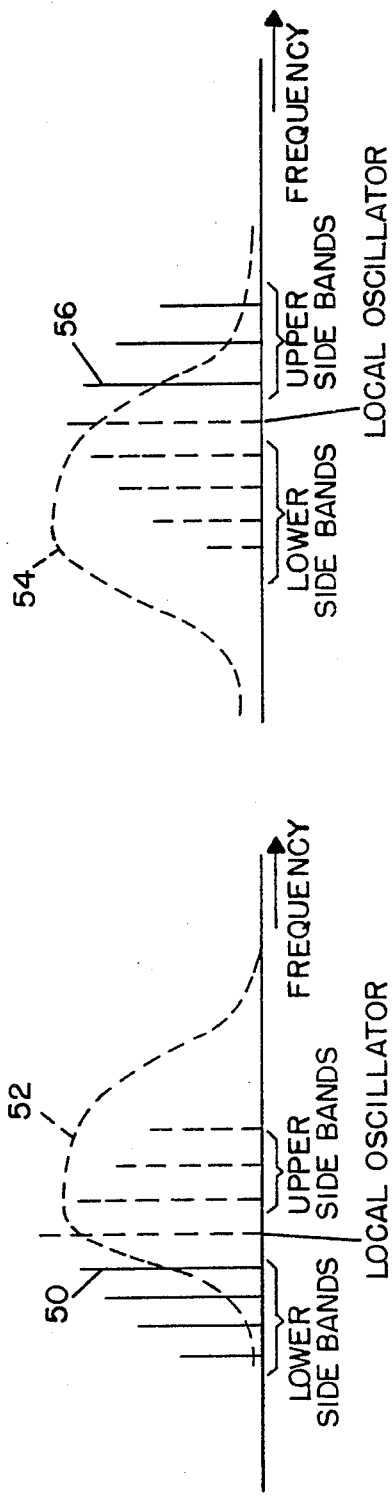
FIG. 2.
FIG. 3.

FREQUENCY CONVERTER

FIELD OF THE INVENTION

This invention relates to frequency conversion and more particularly to a frequency converter adapted to accomplish frequency conversions over a wide range in a single step.

BACKGROUND OF THE INVENTION

In signal transmitters, it is often desirable to up-convert broadband VHF signals (30-80 mHz to the EHF range (30-100 GHz) with medium to high power outputs. Similarly, in receivers it is desirable to similarly traverse the frequency range in the opposite direction.

A problem in accomplishing such conversions is that in the process of the frequency conversion, the heterodyned outputs exhibit sidebands which are so close to the baseband that they cannot be distinguished or filtered out. For instance, assuming it is desired to up-convert a 50 mHz signal to 30 GHz, a 29.95 GHz local oscillator is used with the result being the generation of not only the additive frequency (30 GHz) but also of the difference frequency (29.90 GHz). In addition, a number of lesser amplitude sidebands, each one 50 mHz less or more in frequency, are respectively generated. Filters are not available, at a reasonable cost, to select out the desired frequency products.

The prior art, as a result, has accomplished such frequency conversions by translating up an input frequency in a number of smaller steps so that the desired modulation products could be filtered at each step of up-conversion, the steps being repeated over and over again. Even in such systems, however, the multiple filterings tended to allow propagation of unwanted close-in sidebands. Thus, when the final up-converted signal was achieved, it included a number of unwanted spurious frequencies. If it was then desired to utilize that signal to synchronize an output oscillator, it was extremely difficult, if not impossible to assure that the output oscillator locked onto the desired frequency.

It is known that a free running Gunn or Impatt oscillator will lock onto any signal in the vicinity of its free running oscillation frequency. In fact, if the injected signal is sufficiently large, it can pull in the free running signal of the oscillator to achieve frequency lock, even if the injected signal is as much as 5% away, (depending upon the Q of the oscillator). If there are multiple frequency signals in the vicinity of the free running oscillator's frequency, the oscillator will lock onto the closest signal if all signals are of the same or similar levels or to the closest signal that has sufficient amplitude.

Accordingly, it is an object of this invention to provide a single stage, VHF to millimeter wave (and vice versa) frequency converter.

It is a further object of this invention to provide a single stage, broadband frequency converter wherein the output signal frequency is closely controlled.

SUMMARY OF THE INVENTION

The invention comprises a frequency converter for converting an input frequency to an output frequency where the frequencies are widely separated. The system includes a free running output oscillator adapted to be injection locked to an output frequency. A local oscillator's signal, exhibiting a frequency near the output frequency, is modulated by the input frequency to obtain a signal containing sideband frequencies which are both above and below the local oscillator frequency. Means are provided for separating the sideband frequencies and applying one of the sidebands as an injection locking signal to the free running oscillator. In the preferred embodiment, the bandwidth of the free running output oscillator is centered above the highest sideband frequency if the sideband is lower in frequency than the frequency of the local oscillator; or is centered below the lowest sideband frequency if the sideband is higher in frequency than the frequency of the local oscillator.

DESCRIPTION OF THE DRAWINGS

FIG. 1 is a block diagram of a circuit incorporating the invention.

FIGS. 2 and 3 are frequency diagrams useful in understanding the operation of FIG. 1.

DETAILED DESCRIPTION OF THE INVENTION

Referring now to FIG. 1, a block diagram of a single stage, frequency up-converter in accordance with the invention is illustrated. An input signal is applied via port 10 to a 3dB, 90° quadrature hybrid coupler 11 which has two output ports, 12 and 14 and another port 13 (which is employed for down-conversion purposes). Output port 12 provides the original signal, while the signal emanating from output port 14 is delayed by 90°. The two signals are then each fed to mixers (i.e. 16 and 18). A local oscillator 20 has its output fed through an in-phase power divider to mixers 16 and 18. The frequency of local oscillator 20 is chosen to be near the desired output frequency of the frequency converter.

The mixer products from mixers 16 and 18 are fed by conducters 22 and 24 to a second 3dB, 90° quadrature hybrid coupler 26, one of whose output ports (e.g. 28 or 29) is employed as an injection signal input to frequency lock a free running output oscillator 30.

As will hereinafter be understood, the aforementioned circuitry accomplishes a substantial frequency conversion in one stage; suppresses the local oscillator signal and separates out one sideband for the purpose of using the separated sideband to injection lock an output oscillator.

The circuitry to the left of free running oscillator 30 is commonly known as an image rejection mixer and is structurally known in the art. It acts to separate the modulation products of mixers 16 and 18 so that both the upper and lower sidebands become separately available from hybrid coupler 26.

The bandwidth of output oscillator 30, as employed in this invention, is chosen so that its free running frequency will generally be below the upper sideband frequency range or above the lower sideband frequency range, depending upon which sideband is to be used for injection locking. This assures that when a sideband and its harmonics are injected into output oscillator 30, it locks onto the closest frequency which, in general, will be largest amplitude sideband.

This feature is illustrated in FIG. 2 wherein it is assumed that output oscillator 30 is to be injection locked onto lower sideband frequency 50. The frequency bandwidth of output oscillator 30 is adjusted to take the shape shown by dotted line 52. Thus, in its free running mode, the frequency of local output oscillator 30 will generally be higher than any of the expected lower sideband frequencies so that when injection locking occurs, it will automatically lock onto frequency 50 rather than one of the lower sidebands. If, as shown in FIG. 3, it is desired to have output oscillator 30 lock onto the upper sideband signal, its selected bandwidth characteristic 54 would be shifted to left so that its expected free running frequency would be below the frequency of the major frequency component 56 of the upper side band.

The operation of the invention will now be described in conjunction with FIG. 2.

Let:

$$\text{VHF signal} = \sin w_1 t \quad (a)$$

(e.g. = 50 mHz ± modulation)

$$\text{Local Oscillator 20} = \sin w_2 t \quad (b)$$

(e.g. = 30 GHz)

The signals appearing on lines 12 and 14 are respectively.

$$\text{line 12} = \sin w_1 t \quad (c)$$

$$\text{line 14} = \cos w_1 t \quad (d)$$

The outputs from mixers 16 and 18 on lines 22 and 24 are respectively.

$$\text{line 22} = \sin w_1 t \sin w_2 t \rightarrow \cos(w_2 - w_1)t - \cos(w_1 + w_2)t \quad (e)$$

$$\text{line 24} = \sin w_1 t \cos w_2 t \rightarrow \sin(w_1 + w_2)t + \sin(w_2 - w_1)t \quad (f)$$

The mixer products, as indicated by equations e and f are applied to 90° quadrature hybrid 26. As a result, the input from line 22 has added to it the input from line 24 after such input has been delayed by 90°. In a similar fashion, the input from line 24 has added to it, the input from line 22 after it has experienced a minus 90° phase shift. The result is that the lower sidebands appear at output 28 and the higher sidebands at output 29 and in both cases the local oscillator signal is suppressed. This can be seen from the following equations:

$$\text{line 28} = \cos(w_2 - w_1)t - \cos(w_1 + w_2)t + \cos(w_1 + w_2)t + \cos(w_2 - w_1)t \approx \cos(w_2 - w_1)t \text{ (lower sideband)} \quad (g)$$

$$\text{line 29} = \sin(w_1 + w_2)t + \sin(w_2 - w_1)t - \sin(w_2 - w_1)t + \sin(w_1 + w_2)t = \sin(w_1 + w_2)t \text{ (upper sideband)} \quad (h)$$

The application of the lower sideband signal $\cos(w_2 - w_1)t$ to output oscillator 30 causes it to lock onto the first lower sideband frequency 50 (see FIG. 2). As aforestated, the free running frequency of oscillator 30 (by virtue of the selected bandwidth of that oscillator) is generally, higher than the injected first lower sideband signal.

From the foregoing, it can be seen that output oscillator 30's frequency is directly mixed with the input frequency, notwithstanding the fact that their frequencies are greatly separated. For instance, this system may be used to mix a local oscillator EHF signal (30–100gHz) with a VHF signal (30–80 mHz). Of course, if the VHF signal is modulated, this modulation is carried forward to the EHF signal.

In the receiving or down-conversion mode, the circuit is modified by connecting output oscillator 30 to port 13 rather than port 28 and the input is applied to port 29. If the system is to be used for both transmission and reception, output oscillator 30 will remain connected at port 28 but will be provided with a shunt circuit which disables it during reception. An additional output oscillator will be connected to port 13 and it too, will be provided with a shunt circuit which disables it during transmission.

Assuming the invention is to be operated in the receiving mode, the input signal $\sin w_3 t$ (EHF) is applied to port 29 of 90° Hybrid 26. This results in $\cos w_3 t$ and $\sin w_3 t$ signals appearing on lines 22 and 24 respectively. Those signals are mixed with the local oscillator output $\sin w_2 t$ and cause the appearance of the lower sideband, $\cos(w_2 - w_3)t$ at port 13 of 90° hybrid 11. If that output is then connected to a free running oscillator having a VHF frequency bandwidth centered above the lower sideband frequency, locking to the lower sideband is readily achieved.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. In a frequency converter for converting an input signal frequency into an output signal frequency, said frequencies being widely separated, the combination comprising:

a local oscillator having a signal frequency near said output signal frequency;

mixing means connected to said local oscillator for mixing said local oscillator signal frequency with said input signal frequency to produce signals containing sets of sideband signal frequencies which are both above and below said local oscillator frequency, each said set having a highest amplitude sideband signal frequency and lower amplitude sideband signal frequencies arrayed to one side of said highest amplitude sideband signal frequency;

means connected to said mixing means for combining said signals from said mixing means to produce a signal which includes only one said set of sideband signal frequencies; and a free running output oscillator connected to said combining means and having an output signal frequency spectrum centered on another side of said highest amplitude sideband signal frequency, whereby said output oscillator produces an output signal which is frequency-locked to said highest amplitude sideband signal frequency.

2. The invention as defined in claim 1 wherein said free running output oscillator has a bandwidth centered above the highest applied sideband frequency, if said applied sideband is lower in frequency than said local oscillator.

3. The invention of claim 2 wherein said free running output oscillator has a bandwidth centered below the lowest applied sideband frequency, if said applied sideband is higher in frequency than said local oscillator.

4. The invention of claim 3 wherein said combining means includes a 90° quadrature hybrid coupler.

5. The invention as defined in claim 4 wherein said mixing means includes a pair of balanced mixers to which said input frequency is applied, one of said balanced mixers having said input frequency applied with a 90° phase shift.

6. In a frequency converter for converting an input frequency signal from a source into an output frequency signal, said frequencies being widely separated, the combination comprising:

a local oscillator having a frequency signal near said output frequency signal;

means connected to said source and said local oscillator for mixing said local oscillator frequency signal with said input frequency signal to obtain first and second mixed signals, both said mixed signals containing sideband frequencies above and below said local oscillator frequency signal;

hybrid means connected to said mixing means for combining said first and second mixed signals, without modification, and for combining said first and second mixed signals, after delaying one said mixed signal by 90°, so as to provide an outputs at separate ports, a first sideband signal containing upper sideband frequencies and a second sideband signal containing lower sideband frequencies; and a free running oscillator connected to one said port of said hybrid means, for receiving the first or second sideband signal, as the case may be, the signal output of said free running oscillator lockable to the frequency of an input signal, the frequency of said free running oscillator positioned in the spectrum so that the highest amplitude sideband frequency of said sideband signal is between said local oscillator frequency and remaining lower amplitude sideband frequencies of said sideband signal.

7. The invention as defined in claim 6, wherein said free running output oscillator has a bandwidth centered above the highest sideband frequency, if said output oscillator is connected to said port which provides said sideband signal including said lower sideband frequencies.

8. The invention as in claim 7, wherein said free running output oscillator has a bandwidth centered below the lowest sideband frequency, if said output oscillator is connected to said port which provides said sideband signal including said higher sideband frequencies.

9. In a frequency converter for converting an input frequency signal into an output frequency signal, said frequencies being widely separated, the combination comprising:

first and second 90° quadrature hybrids, each said hybrid being provided with a plurality of ports;

means for applying said input frequency signal to one port of said first hybrid, said first hybrid providing outputs at two of its ports comprising said input frequency signal and said input frequency signal delayed by 90°, respectively;

a first mixer connected between one port of each of said quadrature hybrids for receiving said input frequency signal;

a second mixer connected between one port of each of said quadrature hybrids for receiving said input frequency signal delayed by 90°;

a local oscillator having a signal frequency near said output frequency;

means for applying said local oscillator signal to said mixers in an in phase, balanced manner, so as to enable each said mixer to provide a mixed signal output to respectively connected ports of said second quadrature hybrid, said mixed signal outputs containing upper and lower sets of sideband frequencies centered about the frequency of said local oscillator;

said second quadrature hybrid delaying one said mixed signal by 90° and combining it with the other said mixed signal to substantially eliminate from said mixed signal, one said set of sideband frequencies to thereby reinforce the other said set of sideband frequencies and to provide said reinforced sideband frequencies at an output port; and a free running output oscillator connected to said output port, having an injection lockable output frequency signal which locks to the highest amplitude sideband frequency at said output port.

* * * * *